US011411072B2

(12) United States Patent
Liu et al.

(10) Patent No.: US 11,411,072 B2
(45) Date of Patent: Aug. 9, 2022

(54) DISPLAY SUBSTRATE, DISPLAY DEVICE, MANUFACTURING METHOD, AND REPAIR METHOD FOR DISPLAY SUBSTRATE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Huafeng Liu, Beijing (CN); Shengwei Zhao, Beijing (CN); Chaochao Sun, Beijing (CN); Chao Wang, Beijing (CN); Jingping Lv, Beijing (CN); Lin Xie, Beijing (CN); Guoqing Zhou, Beijing (CN); Panpan Zhang, Beijing (CN); Tengfei Wang, Beijing (CN); Hsinghua Pan, Beijing (CN); Lele Li, Beijing (CN); Zhiqiang Chang, Beijing (CN); Shaocong Dang, Beijing (CN); Shijie Mu, Beijing (CN); Zhen Wang, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 16/648,421

(22) PCT Filed: Apr. 25, 2019

(86) PCT No.: PCT/CN2019/084398
§ 371 (c)(1),
(2) Date: Mar. 18, 2020

(87) PCT Pub. No.: WO2019/218853
PCT Pub. Date: Nov. 21, 2019

(65) Prior Publication Data
US 2021/0376057 A1 Dec. 2, 2021

(30) Foreign Application Priority Data

May 18, 2018 (CN) .......................... 201810479864.4

(51) Int. Cl.
*H01L 49/02* (2006.01)
*G02F 1/1343* (2006.01)
(Continued)

(52) U.S. Cl.
CPC .......... *H01L 28/88* (2013.01); *H01L 27/1255* (2013.01); *G02F 1/1368* (2013.01); *G02F 1/134309* (2013.01); *G02F 1/136259* (2013.01)

(58) Field of Classification Search
CPC ................. H01L 28/88; H01L 27/1255; G02F 1/134309; G02F 1/136259; G02F 1/1368
(Continued)

(56) References Cited

U.S. PATENT DOCUMENTS

2002/0154079 A1* 10/2002 Shiota ............... G02F 1/134363
345/87
2012/0081626 A1* 4/2012 Itoh ................... G02F 1/136259
349/33

FOREIGN PATENT DOCUMENTS

| GN | 102959604 | 3/2013 |
| GN | 108761929 | 11/2018 |
| KR | 1020120055123 | 5/2012 |

* cited by examiner

*Primary Examiner* — Charles S Chang
(74) *Attorney, Agent, or Firm* — Leason Ellis LLP

(57) ABSTRACT

Disclosed are a display substrate, a display device, a manufacturing method and a repairing method. A capacitor structure in the display substrate includes a first electrode and a second electrode. The first electrode includes a first main body portion extending in a first direction, first branch portions extending in a second direction, and a first connection portion connecting the first branch portions to the first
(Continued)

main body portion. The second electrode includes a second main body portion extending in the first direction, second branch portions extending in the second direction, and a second connection portion connecting the second branch portions to the second main body portion. One side of the first electrode having the first branch portions faces one side of the second electrode having the second branch portions, and each first branch portion and a corresponding second branch portion form a capacitor.

15 Claims, 6 Drawing Sheets

(51) Int. Cl.
    *G02F 1/1362* (2006.01)
    *H01L 27/12* (2006.01)
    *G02F 1/1368* (2006.01)
(58) Field of Classification Search
    USPC .............................. 349/54–55, 139–147, 192
    See application file for complete search history.

DISPLAY SUBSTRATE, DISPLAY DEVICE, MANUFACTURING METHOD, AND REPAIR METHOD FOR DISPLAY SUBSTRATE

CROSS-REFERENCE TO RELATED PATENT APPLICATIONS

This application is a U.S. National Stage Application under 35 U.S.C. § 371 of International Patent Application No. PCT/CN2019/084398, filed Apr. 25, 2019, which claims priority of the Chinese Patent Application No. 201810479864.4, filed on May 18, 2018, the disclosures of which are incorporated herein by reference in their entireties as part of the present application. The International Application was published on Nov. 21, 2019, as International Publication No. WO 2019/218853 A1.

TECHNICAL FIELD

At least one embodiment of the present disclosure relates to a display substrate, a display device, a manufacturing method and a repairing method.

BACKGROUND

In the field of display technology, an electric driving method is widely used to drive a display panel for display. With the continuous improvement of thin film transistor manufacturing process, driving circuits that drive display panels for display, such as a gate driving circuit, can be directly integrated on an array substrate to form a GOA (gate driver on array). The gate driving circuit is generally provided with a plurality of capacitor structures. When a capacitor structure is defective due to the lack of a part of the film of the dielectric layer, it can generally be repaired by laser cutting.

SUMMARY

At least one embodiment of the present disclosure provides a display substrate, which includes:

a base substrate and a capacitor structure arranged on the base substrate, the capacitor structure including: a first electrode on the base substrate, a second electrode above the first electrode and insulated from the first electrode;

the first electrode includes: a first main body portion which is strip-shaped and extends in a first direction, a plurality of first branch portions which are strip-shaped and extend in a second direction, and a first connection portion between the first main body portion and the plurality of first branch portions, and the plurality of first branch portions are connected to the first main body portion through the first connection portion;

the second electrode includes: a second main body portion which is strip-shaped and extends in the first direction, a plurality of second branch portions which are strip-shaped and extend in the second direction, and a second connection portion between the second main body portion and the plurality of second branch portions, and the plurality of second branch portions are connected to the second main body portion through the second connection portion;

the first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor.

For example, in the display substrate provided by an embodiment of the present disclosure, an orthographic projection of each first branch portion of the plurality of first branch portions on the base substrate overlaps with an orthographic projection of the corresponding second branch portion of the plurality of second branch portions, at least part of an orthographic projection of the first connection portion on the base substrate does not overlap with an orthographic projection of the plurality of second branch portions on the base substrate, and at least part of an orthographic projection of the second connection portion on the base substrate does not overlap with an orthographic projection of the plurality of first branch portions on the base substrate.

For example, in the display substrate provided by an embodiment of the present disclosure, the first connection portion includes a first sub connection portion which is strip-shaped and extends in the first direction and a second sub connection portion which is strip-shaped and extends in the second direction, the plurality of first branch portions are connected to the first sub connection portion, the first sub connection portion and the first main body portion are spaced apart, and two ends of the first sub connection portion are connected to the first main body portion by the second sub connection portion, the second connection portion includes a third sub connection portion which is strip-shaped and extends in the first direction and a fourth sub connection portion which is strip-shaped and extends in the second direction, the plurality of second branch portions are connected to the third sub connection portion, the third sub connection portion and the second main body portion are spaced apart, and two ends of the third sub connection portion are connected to the second main body portion by the fourth sub connection portion, and at least an orthographic projection of segments of the first sub connection portion at both sides of a junction of the first sub connection portion and each first branch portion on the base substrate does not overlap with an orthographic projection of the plurality of second branch portions on the base substrate, and at least an orthographic projection of segments of the third sub connection portion at both sides of a junction of the third sub connection portion and each second branch portion on the base substrate does not overlap with an orthographic projection of the plurality of first branch portions on the base substrate.

For example, in the display substrate provided by an embodiment of the present disclosure, in the second direction, a distance between the first sub connection portion and the first main body portion is in a range of 2 μm to 4 μm, and a distance between the third sub connection portion and the second main body portion is in a range of 2 μm to 4 μm.

For example, in the display substrate provided by an embodiment of the present disclosure, in the second direction, a width of the first main body portion is in a range of 2 μm to 5 μm, and a width of the second main body portion is in a range of 2 μm to 5 μm.

For example, in the display substrate provided by an embodiment of the present disclosure, the first connection portion includes a plurality of fifth sub connection portions extending in the second direction, the plurality of fifth sub connection portions are in one to one correspondence with the plurality of first branch portions, each of the plurality of first branch portions is connected to the first main body portion through a corresponding fifth sub connection portion of the plurality of fifth sub connection portions, the second connection portion includes a plurality of sixth sub connection portions extending in the second direction, the plurality of sixth sub connection portions are in one to one correspondence with the plurality of second branch portions, each of the plurality of second branch portions is connected to the second main body portion through a corresponding sixth sub connection portion of the plurality of sixth sub connection portions; and an orthographic projection of each of the plurality of fifth sub connection portions on the base substrate does not overlap with an orthographic projection of the plurality of second branch portions on the base substrate, and an orthographic projection of each of the plurality of sixth sub connection portions on the base substrate does not overlap with an orthographic projection of the plurality of first branch portions on the base substrate.

For example, the display substrate provided by an embodiment of the present disclosure further includes: a dielectric layer between the first electrode and the second electrode.

For example, the display substrate provided by an embodiment of the present disclosure further includes: a thin film transistor including a gate electrode and a source drain electrode, and one of the first electrode and the second electrode is on a same layer as the gate electrode of the thin film transistor.

For example, in the display substrate provided by an embodiment of the present disclosure, the other of the first electrode and the second electrode is on a same layer as the source drain electrode of the thin film transistor.

For example, the display substrate provided by an embodiment of the present disclosure further includes: a gate driving circuit including the capacitor structure.

For example, in the display substrate provided by an embodiment of the present disclosure, the display substrate includes one selected from the group consisting of a liquid crystal display substrate, an organic light emitting diode display substrate, a quantum dot light emitting diode display substrate and an inorganic light emitting diode display substrate.

At least one embodiment of the present disclosure further provides a display device, which includes the display substrate provided by any one of the embodiments of the present disclosure.

At least one embodiment of the present disclosure further provides a manufacturing method of a display substrate, which includes: forming a first electrode on a base substrate; and forming a second electrode insulated from the first electrode above the first electrode;

and the first electrode includes: a first main body portion which is strip-shaped and extends in a first direction, a plurality of first branch portions which are strip-shaped and extend in a second direction, and a first connection portion between the first main body portion and the plurality of first branch portions, the plurality of first branch portions are connected to the first main body portion through the first connection portion, the second electrode includes: a second main body portion which is strip-shaped and extends in the first direction, a plurality of second branch portions which are strip-shaped and extend in the second direction, and a second connection portion between the second main body portion and the plurality of second branch portions, the plurality of second branch portions are connected to the second main body portion through the second connection portion, the first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor.

For example, the manufacturing method provided by an embodiment of the present disclosure, before forming the second electrode, further includes: forming a dielectric layer on the first electrode.

At least one embodiment of the present disclosure further provides a repairing method of the display substrate according to any one of the embodiments of the present disclosure, which includes: in a case where a defect occurs between any one first branch portion of the plurality of first branch portions and a second branch portion of the plurality of second branch portions corresponding to the any one first branch portion of the plurality of first branch portions, performing at least one of the following operations:

cutting off a section of the first connection portion connected to the any one first branch portion of the plurality of first branch portions, so as to insulate the any one first branch portion from the first main body portion; or cutting off a section of the second connection portion connected to the second branch portion of the plurality of second branch portions corresponding to the any one first branch portion of the plurality of first branch portions, so as to insulate the second branch portion corresponding to the any one first branch portion from the second main body portion.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left", "right", etc. are only used to indicate the relative positional relationship, and when the absolute position of the object to be described is changed, the relative positional relationship may also change accordingly.

In order to keep the following description of embodiments of the present disclosure clear and concise, detailed descriptions of known functions and known components are omitted from the present disclosure. When any component (element) of an embodiment of the present disclosure appears in more than one drawing, the component (element) is denoted by the same or similar reference number in each drawing.

The "above/on" mentioned in the embodiments of the present disclosure is in terms of the order in which each film layer is formed. For any two film layers, the latterly formed film layer is located above/on the previously formed film layer.

Figure 1:
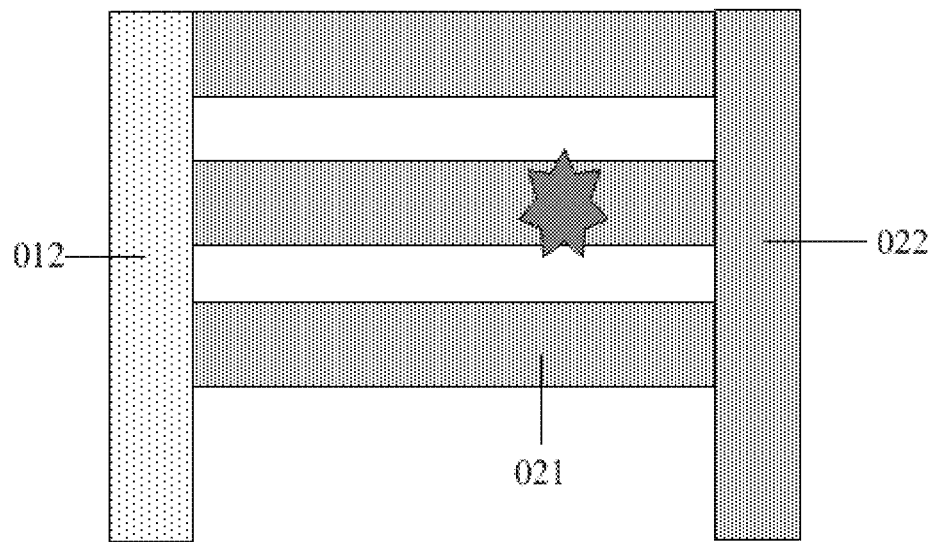
FIG. 1 is a schematic top view of a capacitor structure.
Figure 2:
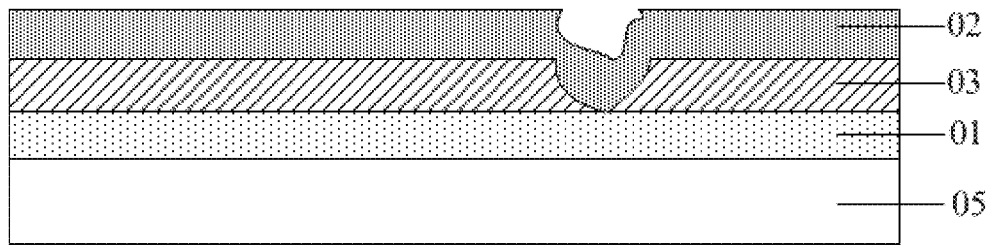
FIG. 2 is a schematic cross-sectional view of the capacitor structure illustrated in FIG. 1 in the case where the capacitor structure is defective.
Figure 3:
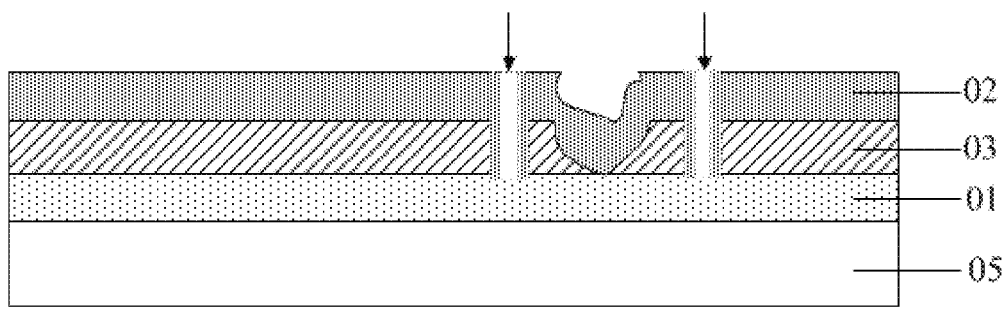
FIG. 3 is a schematic cross-sectional view of the capacitor structure illustrated in FIG. 2 during repair.

FIG. 1 is a schematic top view of a capacitor structure, FIG. 2 is a schematic cross-sectional view of the capacitor structure illustrated in FIG. 1 in the case where the capacitor structure is defective, and FIG. 3 is a schematic cross-sectional view of the capacitor structure illustrated in FIG. 2 during repair.

Referring to FIGS. 1-3, the capacitor structure generally includes a first electrode 01 which is comb-shaped, a dielectric layer 03 on the first electrode, and a second electrode 02 which is comb-shaped on the dielectric layer 03. Referring to FIG. 1, the first electrode 01 includes a first main body portion 012 and a plurality of first branch portions (located below the second branch portions 021, not illustrated in FIG. 1) connected to the first main body portion. The second electrode 02 includes a second main body portion 022 and a plurality of second branch portions 021 connected to the second main body portion 022. Each first branch and a corresponding second branch 021 form a capacitor. Referring to FIG. 2, in the case where the dielectric layer 03 in the middle layer of the capacitor structure encounters particles, there may be a defect of partial film layer missing, resulting in a short circuit between the second electrode 02 and the first electrode 01 of the capacitor structure at the defect.

When repairing this kind of defect, laser cutting is usually used at two sides of the defect position, as illustrated in FIGS. 2 and 3. In this repairing method, due to the large energy of the laser, when laser cutting is performed at two sides of the defect position, the upper and lower metal electrodes of the capacitor structure are easily melted and connected at the cut of the overlapping region (as illustrated by arrows in FIG. 3), thus causing the whole capacitor structure to still be short-circuited. Therefore, when the capacitor structure is repaired, there is a problem that repair failure easily occurs.

At least one embodiment of the present disclosure provides a display substrate, which includes: a base substrate and a capacitor structure arranged on the base substrate. The capacitor structure includes a first electrode on the base substrate and a second electrode above the first electrode and insulated from the first electrode. The first electrode includes a first main body portion which is strip-shaped and extends in a first direction, a plurality of first branch portions which are strip-shaped and extend in a second direction, and a first connection portion between the first main body portion and the plurality of first branch portions, the plurality of first branch portions being connected to the first main body portion through the first connection portion. The second electrode includes a second main body portion which is strip-shaped and extends in the first direction, a plurality of second branch portions which are strip-shaped and extend in the second direction, and a second connection portion between the second main body portion and the plurality of second branch portions, the plurality of second branch portions being connected to the second main body portion through the second connection portion. The first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor.

At least one embodiment of the present disclosure further provides a display device, a manufacturing method and a repairing method corresponding to the display substrate.

In the display substrate provided by the embodiments of the present disclosure, the capacitor structure is divided into a plurality of sub-capacitors which are connected in parallel; in the case where any sub-capacitor is defective, the defective sub-capacitor can be by-passed by cutting off the connection portion corresponding to the defective sub-capacitor, while the remaining sub-capacitors can still work normally; because the connection portion is not located in the overlapping region of the electrodes, the success rate of repair can be improved when performing repair by laser cutting, and further the product yield and quality can be improved.

Some embodiments and examples of the present disclosure will be described in detail below with reference to the accompanying drawings.

Figure 4:
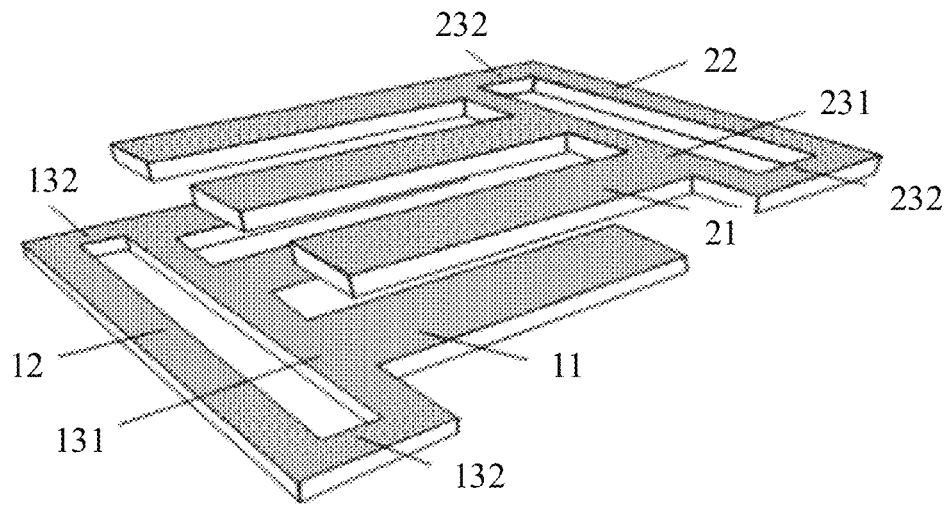
FIG. 4 is a schematic perspective view of a capacitor structure according to at least one embodiment of the present disclosure.

At least one embodiment of the present disclosure provides a display substrate, which includes: a base substrate (referring to the base substrate 05 illustrated in FIGS. 2-3) and a capacitor structure disposed on the base substrate. For example, the base substrate includes but is not limited to a glass substrate, a flexible substrate, and the like. FIG. 4 is a schematic perspective view of a capacitor structure according to at least one embodiment of the present disclosure, and FIG. 5 (corresponding to FIG. 4) is a schematic top view of a capacitor structure provided by at least one embodiment of the disclosure.

Figure 5:
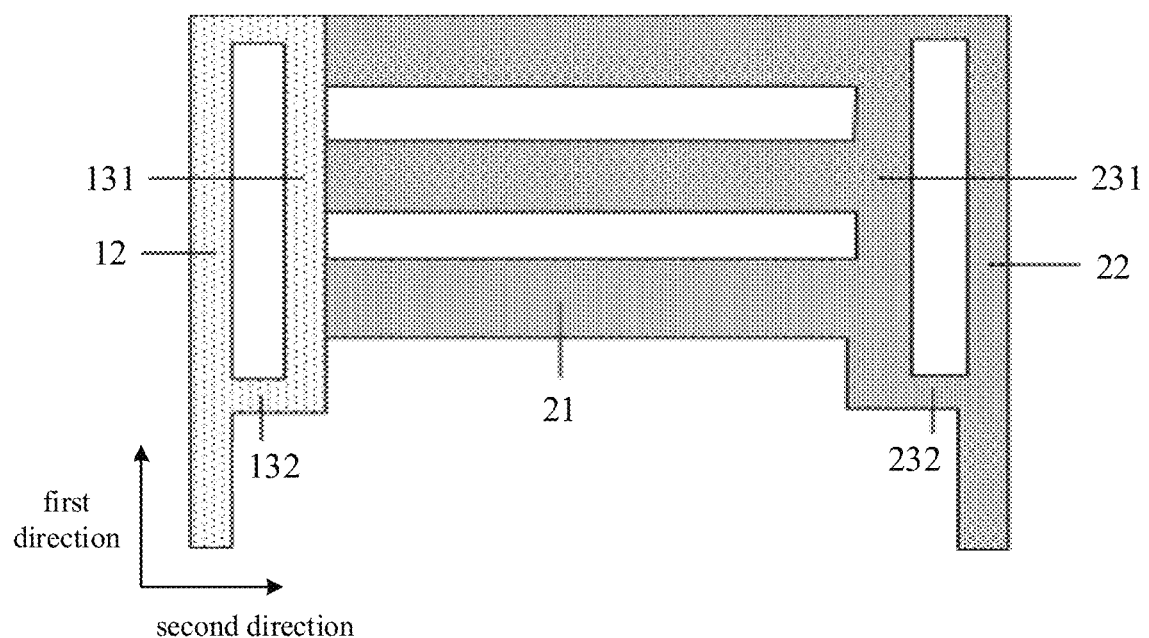
FIG. 5 is a schematic top view of a capacitor structure according to at least one embodiment of the present disclosure.

Referring to FIGS. 4-5, the capacitor structure includes: a first electrode on the base substrate (not illustrated in FIGS. 4-5), and a second electrode above the first electrode and insulated from the first electrode.

The first electrode includes: a first main body portion 12 which is strip-shaped and extends in the first direction, a plurality of first branch portions 11 which are strip-shaped and extend in the second direction (located below the second branch portions 21, not illustrated in FIG. 5), and a first connection portion (illustrated by reference numerals 131 and 132 in FIGS. 4-5) between the first main body portion 12 and the plurality of first branch portions 11, and the plurality of first branch portions 11 are connected to the first main body portion 12 through the first connection portion.

The second electrode includes: a second main body portion 22 which is strip-shaped and extends in the first direction, a plurality of second branch portions 21 which are strip-shaped and extend in the second direction, and a second connection portion (as illustrated by reference numerals 231 and 232 in FIGS. 4-5) between the second main body portion 22 and the plurality of second branch portions 21, and the plurality of second branch portions 21 are connected to the second main body portion 22 through the second connection portion.

One side of the first electrode having the plurality of first branch portions 11 is arranged so as to face one side of the second electrode having the plurality of second branch portions 21, that is, the first main body portion 12 and the second main body portion 22 are located on opposite sides of the first branch portion 11 (and on opposite sides of the second branch portion 21). The plurality of first branch portions 11 are in one to one correspondence with the plurality of second branch portions 21, and each first branch portion 11 and a corresponding second branch portion 21 form a capacitor.

For example, the first direction and the second direction are intersected with each other, for example, as illustrated in FIG. 5, the first direction and the second direction are perpendicular to each other, and the embodiments of the present disclosure include but are not limited to this case.

For example, specifically, in some examples, referring to FIG. 5, an orthographic projection of each first branch portion 11 on the base substrate overlaps with an orthographic projection of a corresponding second branch 21 on the base substrate, so that each first branch 11 and each corresponding second branch 21 form a capacitor. For example, at least part of an orthographic projection of the first connection portion on the base substrate does not overlap with an orthographic projection of the plurality of second branch portions 21 on the base substrate, and correspondingly, at least a portion of the orthographic projection of the second connection portion on the base substrate does not overlap with the orthographic projection of the plurality of first branch portions 11 on the base substrate, and therefore, when any one of the first branch portions 11 and a corresponding second branch portion 21 thereof are defective, the part of the connection portion (i.e., the first connection portion or/and the second connection portion) which is not located in the overlapping region of the electrodes can be processed by laser cutting, so that the problem that the capacitor structure is still short-circuited due to melt connection at the cut of the upper and lower electrodes (i.e. the first electrode and the second electrode) can be avoided.

For example, in some examples, referring to FIGS. 4-5, the first connection portion includes a first sub connection portion 131 which is strip-shaped and extends in the first direction and a second sub connection portion 132 which is strip-shaped and extends in the second direction, a plurality of first branch portions 11 are connected to the first sub connection portion 131, the first sub connection portion 131 is spaced apart from the first main body portion 12, and two ends of the first sub connection portion 131 are connected to the first main body portion through the second sub connection portion 132. The second connection portion includes a third sub connection portion 231 which is strip-shaped and extends in the first direction and a fourth sub connection portion 232 which is strip-shaped and extends in the second direction. The plurality of second branch portions 21 are connected to the third sub connection portion 231, the third sub connection portion 231 is spaced apart from the second main body portion 22, and two ends of the third sub connection portion 231 are connected to the second main body portion 22 through the fourth sub connection portion 232. For example, the extension length of the first main body portion 12 can be greater than the extension length of the first sub connection portion 131, and the extension length of the second main body portion 22 can be greater than the extension length of the third sub connection portion 231, so as to facilitate the connection of the electrode structure to an external circuit through the first main body portion 12 and the second main body portion 22. The embodiments of the present disclosure include but are not limited to this case.

For example, in some examples, referring to FIGS. 4-5, at least an orthographic projection of segments of the first sub connection portion 131 at both sides of a junction of the first sub connection portion 131 and each first branch portion 11 on the base substrate does not overlap with an orthographic projection of the plurality of second branch portions 21 on the base substrate. Correspondingly, at least an orthographic projection of segments of the third sub connection portion 231 at both sides of a junction of the third sub connection portion 231 and each second branch portion 21 on the base substrate does not overlap with an orthographic projection of the plurality of first branch portions 11 on the base substrate. For example, in the first electrode, for the outermost first branch portion of the plurality of first branches 11, one of the segments on both sides of the junction of the first sub connection portion 131 and the outermost first branch (referring to the positions of the cut in FIGS. 6-7) corresponds to a gap between adjacent first branches, the other can be a segment of the first sub connection portion 131 or can be the second sub connection portion 132. For one first branch in the middle of the plurality of first branches 11 (i.e., any one first branch other than the two outermost first branches), the segments on both sides of the junction of the first sub connection 131 and the first branch in the middle correspond to the gaps between the adjacent first branches respectively. Therefore, when any one of the first branch portions 11 is defective, only the segments on both sides of the junction of the first sub connection portion 131 and the any one of the first branch portions 11 need to be cut off by laser. The case of the second electrode is similar to that of the first electrode, which is not repeated in the present disclosure.

Figure 6:
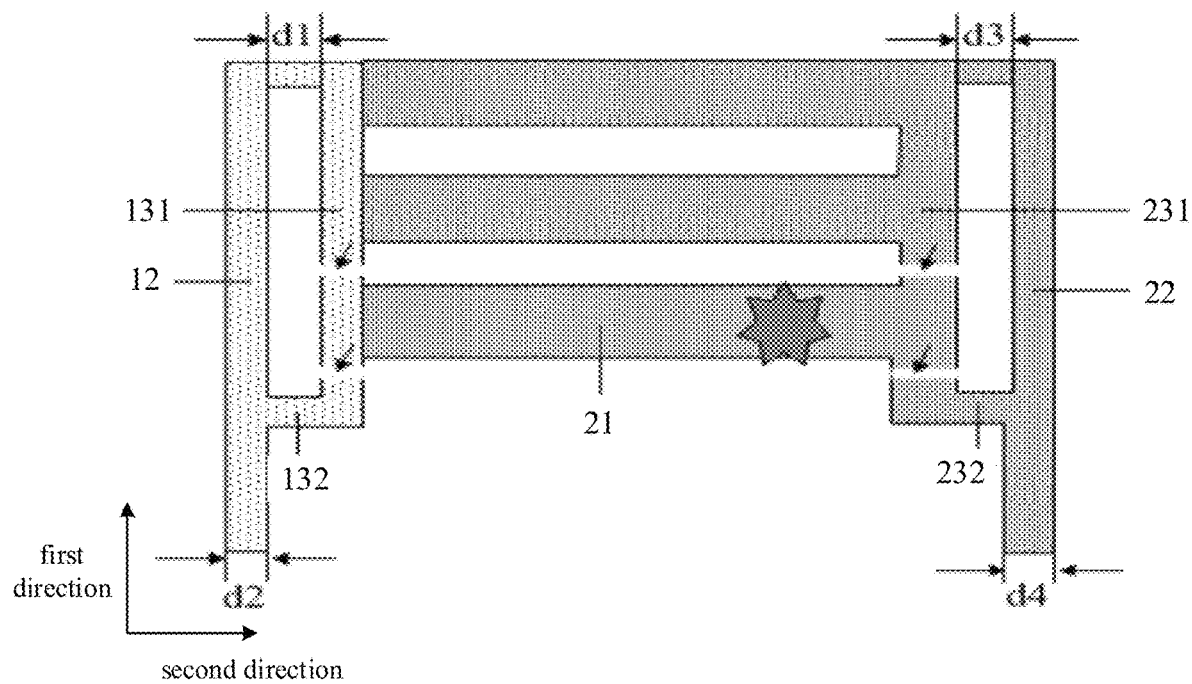
FIG. 6 is a schematic top view of a capacitor structure during repair according to at least one embodiment of the present disclosure.
Figure 7:
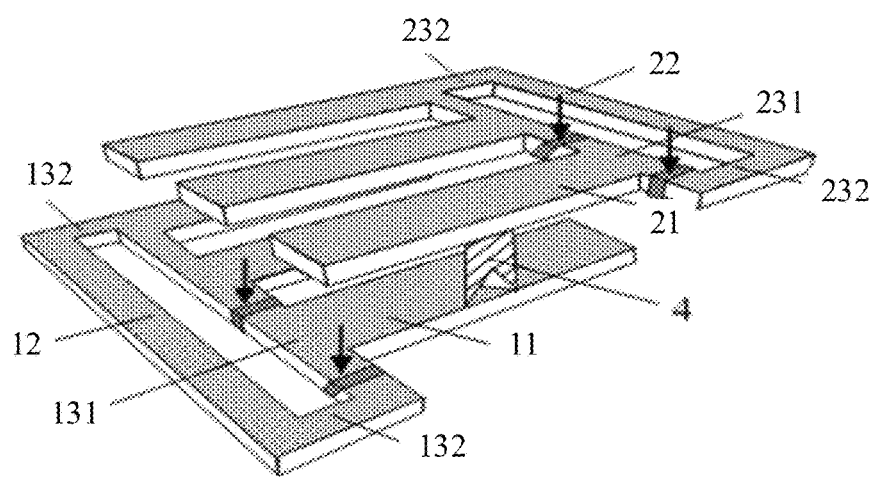
FIG. 7 is a schematic perspective view of a capacitor structure during repair according to at least one embodiment of the present disclosure.

FIG. 6 (corresponding to FIG. 5) is a schematic top view of a capacitor structure during repair according to at least one embodiment of the present disclosure, and FIG. 7 (corresponding to FIG. 6) is a schematic perspective view of a capacitor structure during repair according to at least one embodiment of the present disclosure.

Referring to FIGS. 6 and 7, assumes that a defect occurs between a first branch portion 11 of the first electrode and a corresponding second branch portion 21 of the second electrode, for example, a dielectric layer is provided between the first electrode and the second electrode, and the dielectric layer is defective at the third sub capacitor from top to bottom in FIGS. 6 and 7. Due to the influence of particles (as illustrated by reference numeral 4 in FIG. 7), the third-order first branch 11 of the first electrode and the third-order second branch 21 of the second electrode are short-circuited, and in this case, the segments at both sides of the junction of the first sub connection 131 and the third-order first branch 11 can be cut off (as illustrated by the two arrows on the left in FIGS. 6-7), and segments at both sides of the junction of the third sub connection 231 and the third-order second branch 21 can also be cut off (as illustrated by the two arrows on the right in FIGS. 6-7), so that the first main body portion 12 can supply electrical signals to the remaining first branch portions 11 and the second main body portion 22 can supply electrical signals to the remaining second branch portions 21.

For example, in some examples, considering the laser cutting accuracy of the device, in order to ensure that adjacent patterns are not damaged and the space of the panel can be effectively utilized during laser cutting, as illustrated in FIG. 6, in the second direction, the distance d1 (i.e., the width of the second sub connection portion 132) of the gap between the first main body portion 12 and the first sub connection portion 131 can be in a range of 2 μm to 4 μm. Similarly, the distance d3 (i.e., the width of the fourth sub connection portion 232) of the gap between the second main body portion 22 and the third sub connection portion 231 can be in a range of 2 μm to 4 μm. The embodiments of the present disclosure include but are not limited to this case.

For example, in some examples, the distance between adjacent first branch portions 11 can be in a range of 2 μm to 4 μm, and similarly, the distance between adjacent second branch portions 21 can be in a range of 2 μm to 4 μm. The embodiments of the present disclosure include but are not limited to this case.

For example, considering the limitation of the exposure capability of the process on the minimum line width, and in order to effectively utilize the space of the panel, as illustrated in FIG. 6, in the second direction, a width d2 of the first main body portion 12 is in a range of 2 μm to 5 μm, and similarly, a width d4 of the second main body portion 22 is in a range of 2 μm to 5 μm. The embodiments of the present disclosure include but are not limited to this case.

Figure 8:
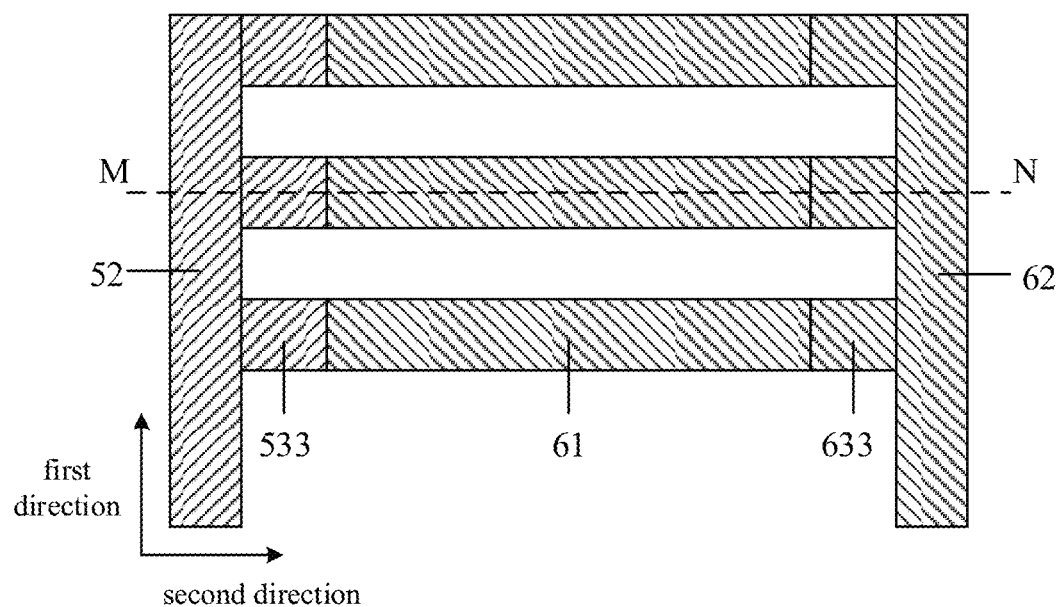
FIG. 8 is a schematic top view of another capacitor structure according to at least one embodiment of the present disclosure.
Figure 9:
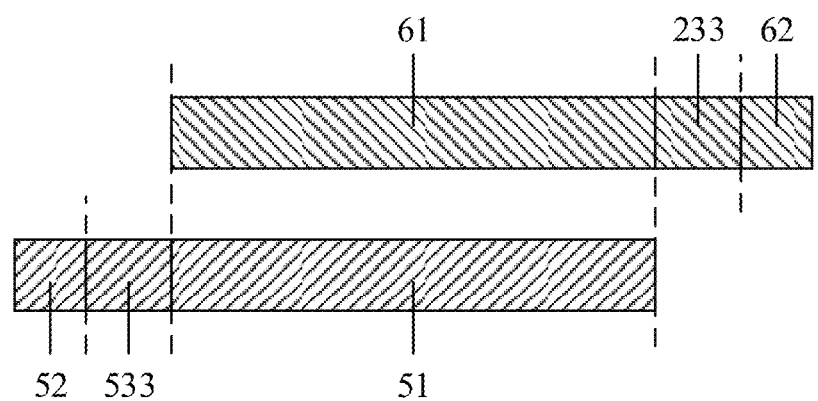
FIG. 9 is a schematic cross-sectional view of the capacitor structure illustrated in FIG. 8 taken along the M-N direction.

FIG. 8 is a schematic top view of another capacitor structure according to at least one embodiment of the present disclosure, and FIG. 9 is a schematic cross-sectional view of the capacitor structure illustrated in FIG. 8 taken along the M-N direction. The capacitor structure illustrated in FIG. 8 differs from the capacitor structure illustrated in FIG. 5 in that the specific structures of the first connection portion and the second connection portion are different, and the structures of other portions are basically the same, and the repetition thereof will not be described herein.

Referring to FIGS. 8-9, in the capacitor structure, the first connection portion includes a plurality of fifth sub connection portions 533 extending in the second direction, the plurality of fifth sub connection portions 533 are in one to one correspondence with the plurality of first branch portions 51 (located below the second branch portions 61, not illustrated in FIG. 8), and each first branch portion 51 is connected to the first main body portion 52 through a corresponding fifth sub connection portion 533. The second connection portion includes a plurality of sixth sub connection portions 633 extending in the second direction, the plurality of sixth sub connection portions 633 are in one to one correspondence with the plurality of second branch portions 61, and each second branch portion 61 is connected to the second main body portion 62 through a corresponding sixth sub connection portion 633.

For example, in some examples, referring to FIGS. 8-9, an orthographic projection of each fifth sub connection portion 533 on the base substrate does not overlap with the orthographic projection of the plurality of second branch portions 61 on the base substrate, and an orthographic projection of each sixth sub connection portion 633 on the base substrate does not overlap with the orthographic projection of the plurality of first branch portions 51 on the base substrate. Therefore, when any sub capacitor formed by a first branch portion 51 and a corresponding second branch portion 61 is defective, only the fifth sub connection portion 533 connected to the first branch portion 51 for forming the defective sub capacitor and/or the sixth sub connection portion 633 connected to the second branch portion 61 for forming the defective sub capacitor need to be cut off by laser.

Figure 10:
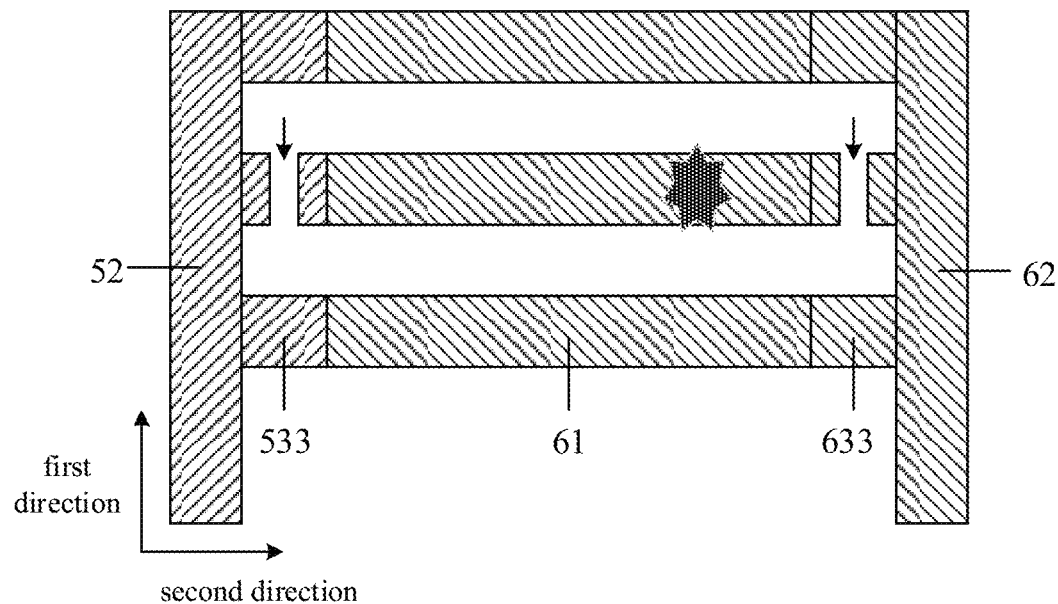
FIG. 10 is another schematic top structural view of a capacitor structure during repair according to at least one embodiment of the present disclosure.

FIG. 10 (corresponding to FIG. 8) is another schematic top view of a capacitor structure during repair according to at least one embodiment of the present disclosure. For example, as illustrated in FIG. 10, due to the influence of particles, the second sub capacitor from top to bottom in the capacitor structure illustrated in FIG. 10 is defective, causing a short circuit between the second-order first branch portion 51 of the first electrode and the second-order second branch portion 61 of the second electrode. In this case, the fifth sub connection portion 533 connected to the second-order first branch portion 51 can be cut off (as illustrated by the arrow on the left in FIG. 10), and the sixth sub connection portion 633 connected to the second-order second branch portion 61 can also be cut off (as illustrated by the arrow on the right in FIG. 10), so that the first main body portion 52 can supply electrical signals to the remaining first branch portions 51 and the second main body portion 62 can supply electrical signals to the remaining second branch portions 61.

For example, in some examples, considering the laser cutting accuracy of the device, in order to ensure that adjacent patterns are not damaged and the space of the panel can be effectively utilized during laser cutting, in the capacitor structure illustrated in FIG. 8, in the second direction, the width of the fifth sub connection portion 533 can be in a range of 2 μm to 4 μm, and similarly, the width of the sixth sub connection portion 633 can be in a range of 2 μm to 4 μm. The embodiments of the present disclosure include but are not limited to this case.

It should be noted that in the embodiments illustrated in FIGS. 4-10, the number of the first branch portions and the number of the second branch portions are illustrative, and the present disclosure is not limited thereto.

For example, the display substrate provided by at least one embodiment of the present disclosure further includes a dielectric layer. The dielectric layer is arranged between the first electrode and the second electrode. The material of the dielectric layer can include, for example, one or a plurality of insulating materials such as silicon oxide, silicon nitride, silicon oxynitride, etc. For example, the material of the dielectric layer can be a high dielectric coefficient insulating material, and the embodiments of the present disclosure are not limited thereto.

For example, the display substrate provided by at least one embodiment of the present disclosure further includes a thin film transistor. For example, the thin film transistor includes but is not limited to an amorphous silicon thin film transistor or an oxide thin film transistor. The thin film transistor includes a gate electrode and a source drain electrode (i.e., source electrode and drain electrode). For example, one of the first electrode and the second electrode can be disposed on a same layer as the gate electrode of the thin film transistor. For example, in some examples, the other of the first electrode and the second electrode can be disposed on a same layer as the source electrode and drain electrode of the thin film transistor, and the present disclosure includes but is not limited to this case. For example, in other examples, the other of the first electrode and the second electrode may not be disposed on the same layer as the source drain electrode of the thin film transistor, and of course, not on the same layer as the gate electrode of the thin film transistor. It should be noted that the device can be thinned and the number of patterning processes can be saved through the same layer arrangement. For example, in some examples, the dielectric layer mentioned above can also serve as a gate insulating layer of the thin film transistor, and the present disclosure includes but is not limited to this case.

For example, the display substrate provided by at least one embodiment of the present disclosure further includes a gate driving circuit. For example, the gate driving circuit can include the above-mentioned capacitor structure, and for example, the gate driving circuit can also include the above-mentioned thin film transistor. For example, in some examples, the display substrate further includes a pixel circuit, and the pixel circuit also includes the above-mentioned capacitor structure. It should be noted that the embodiments of the present disclosure do not limit the specific circuit structures of the gate driving circuit and the pixel circuit.

For example, the display substrate provided by at least one embodiment of the present disclosure can include one selected from the group consisting of a liquid crystal display substrate, an organic light emitting diode display substrate, a quantum dot light emitting diode display substrate, and an inorganic light emitting diode display substrate, and the present disclosure is not limited thereto.

It should be noted that in the display substrate provided by the embodiments of the present disclosure, the first main body portion, the first branch portions and the first connection portions in the first electrode can be integrally formed. Similarly, the second main body portion, the second branch portions and the second connection portions in the second electrode can also be integrally formed. It should be noted that in the embodiments of the present disclosure, a plurality of structures being "integrally formed" means that the plurality of structures are formed into structures connected to each other by a same material through a same patterning process.

Figure 11:
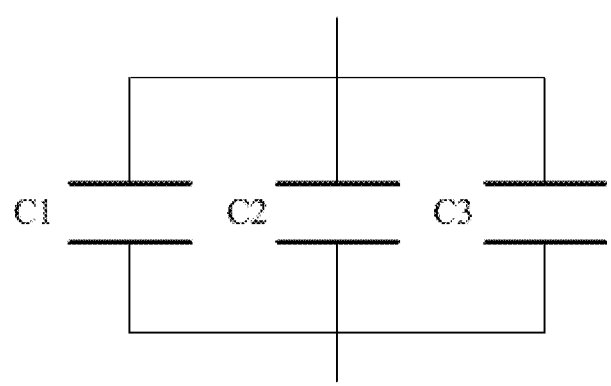
FIG. 11 is a schematic diagram of an equivalence of a capacitor structure according to at least one embodiment of the present disclosure.

In summary, the display substrate provided by the embodiments of the present disclosure includes a base substrate and a capacitor structure disposed on the base substrate. The capacitor structure includes: a first electrode on the base substrate, and a second electrode above the first electrode and insulated from the first electrode. The first electrode includes: a first main body portion which is strip-shaped and extends in a first direction, a plurality of first branch portions which are strip-shaped and extend in a second direction, and a first connection portion between the first main body portion and the plurality of first branch portions, the plurality of first branch portions being connected to the first main body portion through the first connection portion. The second electrode includes: a second main body portion which is strip-shaped and extends in the first direction, a plurality of second branch portions which are strip-shaped and extend in the second direction, and a second connection portion between the second main body portion and the plurality of second branch portions, the plurality of second branch portions being connected to the second main body portion through the second connection portion. The first direction and the second direction are intersected with each other, one side of the first electrode having the plurality of first branch portions is arranged so as to face one side of the second electrode having the plurality of second branch portions, and each first branch portion and a corresponding second branch portion form a capacitor. In this capacitor structure, both the first connection portion and the second connection portion have a part that is not located in the overlapping region of the electrodes, therefore, when a sub capacitor formed by any one of the first branch portions of the first electrode and a corresponding second branch portion of the second electrode is defective, for example, when a partial region of the dielectric layer between the first electrode and the second electrode is influenced by particles such that the film layer in the partial region is missing, a section of the first connection portion connected to the first branch portion can be cut off, so as to insulate the first branch portion from the first main body portion, and/or a section of the second connection portion connected to the second branch portion can be cut off, so as to insulate the second branch portion from the second main body portion, and therefore, the first main body portion can supply electrical signals to the remaining first branch portions and the second main body portion can supply electrical signals to the remaining second branch portions. FIG. 11 is a schematic diagram of an equivalence of a capacitor structure according to at least one embodiment of the present disclosure. For example, as illustrated in FIG. 11, based on the design of dividing the capacitor structure into a plurality of sub capacitors (C1, C2, C3) which are connected in parallel, when the dielectric layer is partially missing, the defective region can be isolated by using laser cutting on only a single-layer metal line, thus avoiding the problem that when a defect exists between the first electrode and the second electrode, performing cutting at two sides of the defect position directly may easily cause the upper electrode and the lower electrode of the capacitor structure to be melted and further cause the whole capacitor structure to be short-circuited.

At least one embodiment of the present disclosure further provides a display device, which includes the display substrate provided by the above embodiments of the present disclosure. For example, the display device provided by the embodiments of the present disclosure can be any product or component having a display function, such as a display panel, a display, a smart mobile phone, a tablet computer, a television, a notebook computer, a digital photo frame, a navigator, etc. The display device can also include other conventional components, and the embodiments of the present disclosure are not limited thereto.

The technical effect of the display device provided by the embodiments of the present disclosure can be referred to the related description of the display substrate in the above embodiments and details will not be repeated here.

Figure 12:
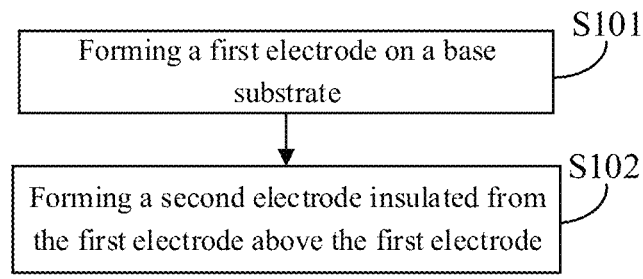
FIG. 12 is a schematic manufacturing flow chart of a capacitor structure according to at least one embodiment of the present disclosure.

At least one embodiment of the present disclosure further provides a manufacturing method of a display substrate. FIG. 12 is a schematic manufacturing flow chart of a capacitor structure according to at least one embodiment of the present disclosure. Referring to FIG. 12, the manufacturing method includes:

Step S101: forming a first electrode on a base substrate.

For example, the base substrate includes but is not limited to a glass substrate, a flexible substrate, and the like. For example, as illustrated in FIG. 5 or FIG. 8, the first electrode includes a first main body portion (12 or 52) which is strip-shaped and extends in a first direction, a plurality of first branch portions (11 or 51) which are strip-shaped and extend in a second direction, and a first connection portion (131 and 132, or 533) between the first main body portion (12 or 52) and the plurality of first branch portions (11 or 51), and the plurality of first branch portions (11 or 51) are connected to the first main body portion (12 or 52) through the first connection portion (131 and 132, or 533). Specifically, reference can be made to the above description of the embodiments illustrated in FIGS. 5 and 8. For example, the first electrode can be formed by a one-step patterning process, and the one-step patterning process here means that the first main body portion, the first branch portions and the first connection portion are formed by one exposure using a same mask plate.

Step S102: forming a second electrode insulated from the first electrode above the first electrode.

For example, referring to FIG. 5 or FIG. 8 (corresponding to the first electrode), the second electrode includes a second main body portion (22 or 62) which is strip-shaped and extends in the first direction, a plurality of second branch portions (21 or 61) which are strip-shaped and extend in the second direction, and a second connection portion (231 and 232, or 633) between the second main body portion (22 or 62) and the plurality of second branch portions (21 or 61), and the plurality of second branch portions (21 or 61) are connected to the second main body portion (22 or 62) through the second connection portions (231 and 232, or 633). For example, similar to forming the first electrode, the second electrode can also be formed by a one-step patterning process, i.e., the second main body portion, the second branch portions and the second connection portion are formed by one exposure using a same mask plate.

For example, as illustrated in FIG. 5 or FIG. 8, one side of the first electrode having the plurality of first branch portions is arranged so as to face one side of the second electrode having the plurality of second branch portions, that is, the first main body portion and the second main body portion are on opposite sides of the first branch portion (and on opposite sides of the second branch portion). The plurality of first branch portions are in one to one correspondence with the plurality of second branch portions, and each first branch portion and a corresponding second branch portion form a capacitor. For example, the first direction and the second direction are intersected with each other, and for example, as illustrated in FIG. 5 or FIG. 8, the first direction and the second direction are perpendicular to each other, and the embodiments of the present disclosure include but are not limited to this case.

Figure 13:
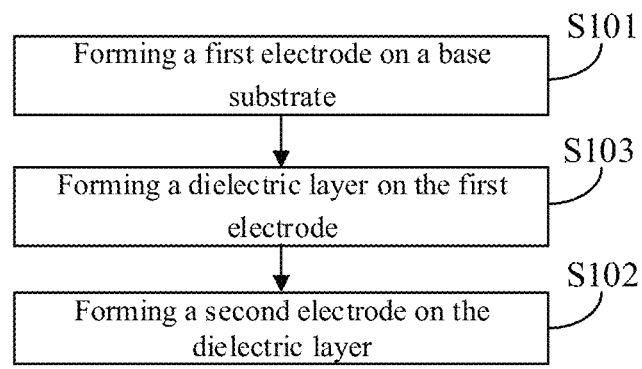
FIG. 13 is a schematic manufacturing flow chart of another capacitor structure according to at least one embodiment of the present disclosure.

At least one embodiment of the present disclosure further provides another manufacturing method of the display substrate. FIG. 13 is a schematic manufacturing flow chart of another capacitor structure according to at least one embodiment of the present disclosure. Referring to FIG. 13, on the basis of the manufacturing method illustrated in FIG. 12, the manufacturing method illustrated in FIG. 13 further includes step S103 between step S101 and step S102. That is, as illustrated in FIG. 13, before forming the second electrode, the manufacturing method further includes:

Step S103: forming a dielectric layer on the first electrode.

For example, the material of the dielectric layer can include one or a plurality of insulating materials such as silicon oxide, silicon nitride, silicon oxynitride, etc. For example, the material of the dielectric layer can be a high dielectric coefficient insulating material, and the embodiments of the present disclosure are not limited thereto. For example, the dielectric layer can be formed by using a vapor deposition method, and the embodiments of the present disclosure include but are not limited to this case.

For example, correspondingly, referring to FIG. 13, step S102 can be specifically realized as: forming a second electrode on the dielectric layer.

The technical effect of the manufacturing method provided by the embodiments of the present disclosure can be referred to the corresponding description of the display substrate in the above embodiments and details will not be repeated here.

Figure 14:
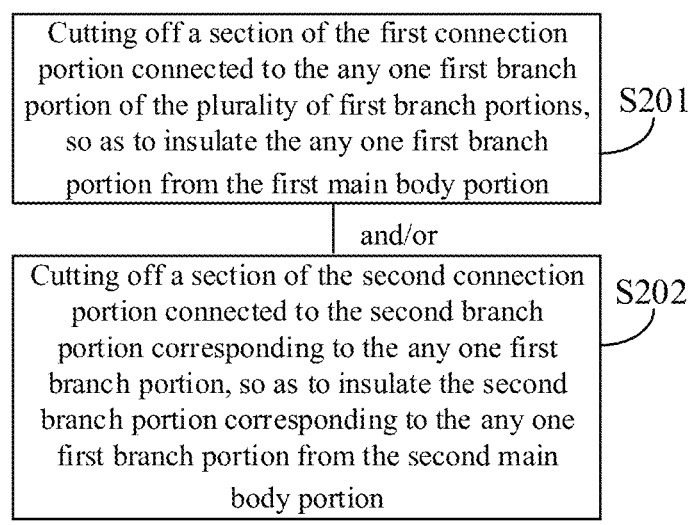
FIG. 14 is a schematic repairing flow chart of a capacitor structure according to at least one embodiment of the present disclosure.

At least one embodiment of the present disclosure further provides a repairing method for repairing the display substrate provided by the above embodiments of the present disclosure. As illustrated in FIG. 14, the repairing method includes: in the case where a defect occurs between any one first branch portion and a second branch portion corresponding to the any one first branch portion, performing at least one of steps S201 and S202:

Step S201: cutting off a section of the first connection portion connected to the any one first branch portion of the plurality of first branch portions, so as to insulate the any one first branch portion from the first main body portion;

Step S202: cutting off a section of the second connection portion connected to the second branch portion corresponding to the any one first branch portion, so as to insulate the second branch portion corresponding to the any one first branch portion from the second main body portion.

For example, in some examples, only the operation in step S201 may be performed. In some other examples, only the operation in step S202 may be performed. In still some other examples, the operations in step S201 and step S202 may be performed simultaneously.

It should be noted that the main purpose of step S201 is to insulate the defective first branch portion from the first main body portion by cutting off a section of the first connection portion connected to the defective first branch portion (this section is not located in the overlapping region of the electrodes), and to make the remaining first branch portions still work normally. Correspondingly, the main purpose of step S202 is to insulate the defective second branch portion from the second main body portion by cutting off a section of the second connection portion connected to the defective second branch portion (this section is not located in the overlapping region of the electrodes, either), and to make the remaining second branch portions still work normally. For example, steps S201 and S202 can be implemented by means of laser cutting. Because the cut positions do not belong to the overlapping region of the electrodes in steps S201 and S202, the problem of short circuit of the entire capacitor structure caused by melting of the upper and lower electrodes during laser cutting can be avoided. For example, the specific implementation process of steps S201 and step S202 can be referred to the related description of the embodiments illustrated in FIGS. 6 and 10, and details will not be repeated here.

The technical effect of the repairing method provided by the embodiments of the present disclosure can be referred to the related description of the display substrate in the above embodiments and details will not be repeated here.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, the embodiments of the present disclosure and the features in the embodiments can be combined with each other to obtain new embodiments.

The foregoing embodiments merely are exemplary embodiments of the disclosure, but the protection scope of the present disclosure is not limited to this. Any person skilled in the art can easily think of changes or substitutions within the technical scope of the present disclosure, and should be covered within the protection scope of the present disclosure. Therefore, the protection scope of the present disclosure shall be subject to the scope of protection of the claims.

What is claimed is:

1. A display substrate, comprising:
a base substrate and a capacitor structure arranged on the base substrate, the capacitor structure comprising: a first electrode on the base substrate, a second electrode above the first electrode and insulated from the first electrode, wherein
the first electrode comprises: a first main body portion which is strip-shaped and extends in a first direction, a plurality of first branch portions which are strip-shaped and extend in a second direction, and a first connection portion between the first main body portion and the plurality of first branch portions, and the plurality of first branch portions are connected to the first main body portion through the first connection portion;
the second electrode comprises: a second main body portion which is strip-shaped and extends in the first direction, a plurality of second branch portions which are strip-shaped and extend in the second direction, and a second connection portion between the second main body portion and the plurality of second branch portions, and the plurality of second branch portions are connected to the second main body portion through the second connection portion;
the first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor;
an orthographic projection of each first branch portion of the plurality of first branch portions on the base substrate overlaps with an orthographic projection of the corresponding second branch portion of the plurality of second branch portions, at least part of an orthographic projection of the first connection portion on the base substrate does not overlap with an orthographic projection of the plurality of second branch portions on the base substrate, and at least part of an orthographic projection of the second connection portion on the base substrate does not overlap with an orthographic projection of the plurality of first branch portions on the base substrate;
the first connection portion comprises a first sub connection portion which is strip-shaped and extends in the first direction and a second sub connection portion which is strip-shaped and extends in the second direction, the plurality of first branch portions are connected to the first sub connection portion, the first sub connection portion and the first main body portion are spaced apart, and two ends of the first sub connection portion are connected to the first main body portion by the second sub connection portion,
the second connection portion comprises a third sub connection portion which is strip-shaped and extends in the first direction and a fourth sub connection portion which is strip-shaped and extends in the second direction, the plurality of second branch portions are connected to the third sub connection portion, the third sub connection portion and the second main body portion are spaced apart, and two ends of the third sub connection portion are connected to the second main body portion by the fourth sub connection portion, and
at least an orthographic projection of segments of the first sub connection portion at both sides of a junction of the first sub connection portion and each first branch portion on the base substrate does not overlap with an orthographic projection of the plurality of second branch portions on the base substrate, and at least an orthographic projection of segments of the third sub connection portion at both sides of a junction of the third sub connection portion and each second branch portion on the base substrate does not overlap with an orthographic projection of the plurality of first branch portions on the base substrate.

2. The display substrate according to claim 1, wherein in the second direction, a distance between the first sub connection portion and the first main body portion is in a range of 2 µm to 4 µm, and a distance between the third sub connection portion and the second main body portion is in a range of 2 µm to 4 µm.

3. The display substrate according to claim 2, wherein in the second direction, a width of the first main body portion is in a range of 2 µm to 5 µm, and a width of the second main body portion is in a range of 2 µm to 5 µm.

4. The display substrate according to claim 1, further comprising: a dielectric layer between the first electrode and the second electrode.

5. The display substrate according to claim 1, further comprising: a thin film transistor comprising a gate electrode and a source drain electrode,
wherein one of the first electrode and the second electrode is on a same layer as the gate electrode of the thin film transistor.

6. The display substrate according to claim 5, wherein the other of the first electrode and the second electrode is on a same layer as the source drain electrode of the thin film transistor.

7. The display substrate according to claim 1, further comprising: a gate driving circuit comprising the capacitor structure.

8. The display substrate according to claim 1, wherein the display substrate comprises one selected from the group consisting of a liquid crystal display substrate, an organic light emitting diode display substrate, a quantum dot light emitting diode display substrate and an inorganic light emitting diode display substrate.

9. A display device, comprising the display substrate according to claim 1.

10. A repairing method of the display substrate according to claim 1, comprising:
   in a case where a defect occurs between any one first branch portion of the plurality of first branch portions and a second branch portion of the plurality of second branch portions corresponding to the any one first branch portion of the plurality of first branch portions, performing at least one of the following operations:
   cutting off a section of the first connection portion connected to the any one first branch portion of the plurality of first branch portions, so as to insulate the any one first branch portion from the first main body portion; or
   cutting off a section of the second connection portion connected to the second branch portion of the plurality of second branch portions corresponding to the any one first branch portion of the plurality of first branch portions, so as to insulate the second branch portion corresponding to the any one first branch portion from the second main body portion.

11. The display substrate according to claim 1, wherein
   the first connection portion comprises a first sub connection portion which is strip-shaped and extends in the first direction and a second sub connection portion which is strip-shaped and extends in the second direction, the plurality of first branch portions are connected to the first sub connection portion, the first sub connection portion and the first main body portion are spaced apart, and two ends of the first sub connection portion are connected to the first main body portion by the second sub connection portion,
   the second connection portion comprises a third sub connection portion which is strip-shaped and extends in the first direction and a fourth sub connection portion which is strip-shaped and extends in the second direction, the plurality of second branch portions are connected to the third sub connection portion, the third sub connection portion and the second main body portion are spaced apart, and two ends of the third sub connection portion are connected to the second main body portion by the fourth sub connection portion, and
   at least an orthographic projection of segments of the first sub connection portion at both sides of a junction of the first sub connection portion and each first branch portion on the base substrate does not overlap with an orthographic projection of the plurality of second branch portions on the base substrate, and at least an orthographic projection of segments of the third sub connection portion at both sides of a junction of the third sub connection portion and each second branch portion on the base substrate does not overlap with an orthographic projection of the plurality of first branch portions on the base substrate.

12. The display substrate according to claim 1, wherein
   the first connection portion comprises a plurality of fifth sub connection portions extending in the second direction, the plurality of fifth sub connection portions are in one to one correspondence with the plurality of first branch portions, each of the plurality of first branch portions is connected to the first main body portion through a corresponding fifth sub connection portion of the plurality of fifth sub connection portions,
   the second connection portion comprises a plurality of sixth sub connection portions extending in the second direction, the plurality of sixth sub connection portions are in one to one correspondence with the plurality of second branch portions, each of the plurality of second branch portions is connected to the second main body portion through a corresponding sixth sub connection portion of the plurality of sixth sub connection portions; and
   an orthographic projection of each of the plurality of fifth sub connection portions on the base substrate does not overlap with an orthographic projection of the plurality of second branch portions on the base substrate, and an orthographic projection of each of the plurality of sixth sub connection portions on the base substrate does not overlap with an orthographic projection of the plurality of first branch portions on the base substrate.

13. A display substrate, comprising:
   a base substrate and a capacitor structure arranged on the base substrate, the capacitor structure comprising: a first electrode on the base substrate, a second electrode above the first electrode and insulated from the first electrode, wherein
   the first electrode comprises: a first main body portion which is strip-shaped and extends in a first direction, a plurality of first branch portions which are strip-shaped and extend in a second direction, and a first connection portion between the first main body portion and the plurality of first branch portions, and the plurality of first branch portions are connected to the first main body portion through the first connection portion;
   the second electrode comprises: a second main body portion which is strip-shaped and extends in the first direction, a plurality of second branch portions which are strip-shaped and extend in the second direction, and a second connection portion between the second main body portion and the plurality of second branch portions, and the plurality of second branch portions are connected to the second main body portion through the second connection portion;
   the first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor;
   the first connection portion comprises a plurality of fifth sub connection portions extending in the second direction, the plurality of fifth sub connection portions are in one to one correspondence with the plurality of first branch portions, each of the plurality of first branch portions is connected to the first main body portion through a corresponding fifth sub connection portion of the plurality of fifth sub connection portions, the second connection portion comprises a plurality of sixth sub connection portions extending in the second direction, the plurality of sixth sub connection portions are in one to one correspondence with the plurality of second branch portions, each of the plurality of second branch portions is connected to the second main body portion through a corresponding sixth sub connection portion of the plurality of sixth sub connection portions; and an orthographic projection of each of the plurality of fifth sub connection portions on the base substrate does not overlap with an orthographic projection of the plurality of second branch portions on the base substrate, and an orthographic projection of each of the plurality of sixth sub connection portions on the base substrate does not overlap with an orthographic projection of the plurality of first branch portions on the base substrate.

14. A manufacturing method of a display substrate, comprising:

forming a first electrode on a base substrate;

forming a second electrode insulated from the first electrode above the first electrode, wherein the first electrode comprises: a first main body portion which is strip-shaped and extends in a first direction, a plurality of first branch portions which are strip-shaped and extend in a second direction, and a first connection portion between the first main body portion and the plurality of first branch portions, the plurality of first branch portions are connected to the first main body portion through the first connection portion, the second electrode comprises: a second main body portion which is strip-shaped and extends in the first direction, a plurality of second branch portions which are strip-shaped and extend in the second direction, and a second connection portion between the second main body portion and the plurality of second branch portions, the plurality of second branch portions are connected to the second main body portion through the second connection portion, the first direction and the second direction are intersected with each other, one side of the first electrode having the plurality of first branch portions is arranged so as to face one side of the second electrode having the plurality of second branch portions, and each first branch portion of the plurality of first branch portions and a corresponding second branch portion of the plurality of second branch portions form a capacitor;

the first connection portion comprises a first sub connection portion which is strip-shaped and extends in the first direction and a second sub connection portion which is strip-shaped and extends in the second direction, the plurality of first branch portions are connected to the first sub connection portion, the first sub connection portion and the first main body portion are spaced apart, and two ends of the first sub connection portion are connected to the first main body portion by the second sub connection portion, the second connection portion comprises a third sub connection portion which is strip-shaped and extends in the first direction and a fourth sub connection portion which is strip-shaped and extends in the second direction, the plurality of second branch portions are connected to the third sub connection portion, the third sub connection portion and the second main body portion are spaced apart, and two ends of the third sub connection portion are connected to the second main body portion by the fourth sub connection portion, and at least an orthographic projection of segments of the first sub connection portion at both sides of a junction of the first sub connection portion and each first branch portion on the base substrate does not overlap with an orthographic projection of the plurality of second branch portions on the base substrate, and at least an orthographic projection of segments of the third sub connection portion at both sides of a junction of the third sub connection portion and each second branch portion on the base substrate does not overlap with an orthographic projection of the plurality of first branch portions on the base substrate.

15. The manufacturing method according to claim 14, wherein before forming the second electrode, the manufacturing method further comprises:

forming a dielectric layer on the first electrode.

* * * * *